United States Patent [19]

Tomizawa et al.

[11] Patent Number: 4,704,257
[45] Date of Patent: Nov. 3, 1987

[54] APPARATUS FOR GROWING SINGLE CRYSTALS OF DISSOCIATIVE COMPOUNDS

[75] Inventors: Kenji Tomizawa, Ohmiya; Koichi Sassa, Tokyo; Yasushi Shimanuki, Hasuda, all of Japan

[73] Assignees: Research Development Corporation of Japan; Mitsubishi Metal Corporation, both of Tokyo, Japan

[21] Appl. No.: 644,840

[22] Filed: Aug. 28, 1984

[30] Foreign Application Priority Data

Aug. 31, 1983 [JP] Japan ............................. 58-157883
May 31, 1984 [JP] Japan ............................. 59-109632

[51] Int. Cl.⁴ ............................................. C30B 15/00
[52] U.S. Cl. ............................. 422/249; 156/617 SP; 156/DIG. 93; 156/89
[58] Field of Search ............ 156/617 SP, 617 V, 624, 156/DIG. 93, DIG. 70, DIG. 72, DIG. 77, DIG. 81, DIG. 92, DIG. 89; 202/268, 269; 422/249; 220/3

[56] References Cited

U.S. PATENT DOCUMENTS

| | | | |
|---|---|---|---|
| 412,702 | 10/1889 | Fleischer | 220/3 X |
| 1,646,325 | 10/1927 | Strassmann | 202/269 |
| 2,311,349 | 2/1943 | Puening | 202/268 X |
| 3,401,023 | 9/1968 | Mullin | 156/607 X |
| 3,647,389 | 3/1972 | Weiner | 156/607 X |
| 3,716,345 | 2/1973 | Grabmaier | 156/DIG. 93 |
| 3,857,679 | 12/1974 | Allred | 422/249 |
| 4,014,656 | 3/1977 | Leibenzeder et al. | 156/601 X |
| 4,315,796 | 2/1982 | Nishizawa | 156/622 X |

OTHER PUBLICATIONS

Nygren et al; Properties of GaP Single Crystals Grown by Liquid Encapsulated Pulling; J. Electrochem. Soc. Solid State Science, vol. 118, No. 2, 2/'71, pp. 306-312.
Moulin et al; Growth of GaAs Single Crystals by a Rotating Liquid Seal Method; J. of Crystal Growth, 24/25 (1974) 376-9.
Leung et al; Liquid-Seal Czochralski Growth of Gallium Arsenide; J. of Crystal, Growth 19 (1973) 356-8.

Primary Examiner—Barry S. Richman
Assistant Examiner—Michael S. Gzybowski
Attorney, Agent, or Firm—Flynn, Thiel, Boutell & Tanis

[57] ABSTRACT

An apparatus for pulling single crystals of dissociative compounds, with a volatile component gas sealed in a growth chamber at a controlled pressure thereof, is disclosed, wherein the chamber is made of one or more materials selected from the group consisting of ceramics, gas-tight carbon, heat-resistant metallic materials, ceramic-coated carbon and ceramic-coated heat-resistant metallic materials, the chamber can be divided, with a structure of the divided portion of the chamber capable of being sealed by making use of a sealing material with a pressure exerted on the seal, and an optical window is disposed in the chamber through which the growing state of the crystal in the chamber can be observed.

12 Claims, 5 Drawing Figures

FIG. 3
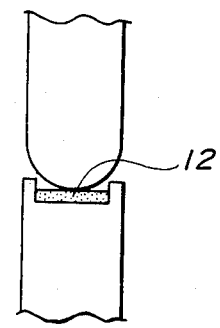
FIG. 4(a)  FIG. 4(b)
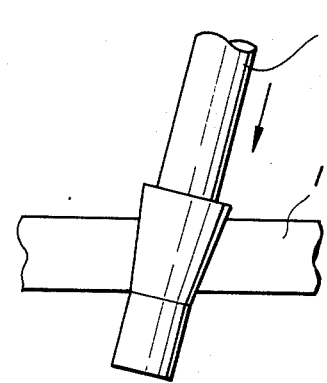
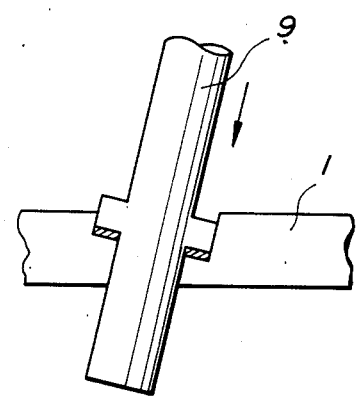

APPARATUS FOR GROWING SINGLE CRYSTALS OF DISSOCIATIVE COMPOUNDS

BACKGROUND OF THE INVENTION

The present invention relates to an apparatus for growing single crystals of dissociative semi-conducting compounds such as GaAs, InAs, GaP and InP, which are suitable for the production of the substrates of IC devices and optical devices.

In the production of single crystals of dissociative compounds, it is important to control the stoichiometry of the single crystals. If there is some deviation in the stoichiometry in the melt material for producing a single crystal, point defects are introduced into the crystal. The point defects aggregate and grow to dislocation loops in the crystal. Furthermore, the point defects may possibly reduce the resistance against plastic deformation of the crystal and also increase the dislocation density. It is known that the thus formed lattice defects have significant adverse effects, for instance, on the performance of IC devices using such single crystals. In order to most appropriately control the stoichiometry of the melt materials for producing a single crystal, it is considered to be effective to grow the single crystal, with the melt equilibrated with a volatile component gas at an optimum pressure. For an apparatus employed for this purpose, a technique of sealing the volatile component gas at high temperatures is supremely important. By taking as an example a dissociative compound, GaAs, the importance of the technique will now be explained. Conventionally, a GaAs single crystal is produced by Horizontal Bridgman Method (hereinafter referred to as the HB method) or by Liquid Encapsulated Czochralski method (hereinafter referred to as the LEC method). These conventional methods, however, have the following shortcomings and cannot sufficiently meet the following requirements. For instance, round semi-insulating wafers with (100) surfaces are required for use in IC substrates. The HB method in which a single crystal is grown in a boat with the GaAs melt equilibrated with an arsenic gas has the advantage that the defect density may be controlled. However, it has the shortcoming that since an ingot with a <111> direction is grown in a quartz boat in the method, the ingot must be cut into a wafer at an angle of 54.7° with respect to the growing direction of the crystal and then the wafer must be cut out into a round shape. These processes are not only extra ones to be eliminated, but also can cause an inhomogeneity of impurities and defects within the wafer. Furthermore, in the HB method, a quartz ampule containing the boat must be sealed by welding before the growth process and it must be then cut again in order to take out the crystal therefrom.

In the LEC method, however, in order to avoid dissociative loss of As, the entire surface of the GaAs melt in a crucible is sealed with a $B_2O_3$ liquid. In this method, it is difficult to optimize the crystal growth so as to minimize the density of point defects. In other words, because the fraction of the constituent elements is decided by the composition of the source material synthesized, precise control of the melt stoichiometry during the crystal growth is impossible, so that a number of point defects are apt to be introduced into the crystal due to the non-stoichiometry. The inhomogeneity of the defect density is inevitable in the growth direction. Furthermore, in this method, the temperature gradient near the liquid-solid interface cannot be reduced significantly, since the dissociative loss of As from the crystal surface takes place. For this reason, the dislocation density increases due to the thermal strain during the cooling process.

In order to eliminate the shortcomings of these conventional methods, it is necessary to adopt a pulling method which allows a single crystal to grow in a <100> direction at a controlled arsenic pressure. Methods to pull single crystals in a sealed chamber were reported by P. C. Leung and W. P. Allred in the Journal of Crystal Growth, Vol. 19 (1973), pages 356-358, by M. Moulin, M. Faure and G. Bichon in the Journal of Crystal Growth 24/25 (1974), pages 376-379 and by J. B. Mullin, W. R. Macewan, C. H. Holliday and A. E. V. Webb in the Journal of Crystal Growth 13/14 (1972), pages 629-634. The method in the first report, however, has the shortcoming that a growth chamber, in which an arsenic gas is sealed, must be cut after the growth process in order to take out the crystal therefrom as in the HB method. In the method described in the second and third reports, the growth chamber can be divided at a taper joint. However, a tight taper joint, if it is applied to a seal portion with a large diameter, the joint will become very difficult to divide again. Furthermore, since the growth chambers in the above reports are made of quartz which is softened when heated to 1240° C. (the melting point of GaAs), the chamber may be unfavorably deformed if the pressure difference becomes large across the chamber wall. The above-mentioned shortcomings make it difficult to scale up the size of the growth chamber so as to produce single crystals with a large diameter.

It seems that these shortcomings hindered these apparatus from being developed to an industrial one, although these methods had the advantage over the LEC method.

Thus, there is a strong industrial demand for development of a crystal pulling apparatus which is capable of growing single crystals, semi-insulating or conductive and with a large diameter, at a controlled arsenic pressure. Such an apparatus should have a growth chamber with the following features:

(1) It can retain its mechanical strength and gastightness at temperatures as high as 1300° C. in a volatile component gas atmosphere.

(2) It can be divided without destruction and the divided portion of the chamber can be sealed tightly without difficulty, so that the chamber can be used repeatedly.

(3) It has an optical window through which the growing state of the crystal can be observed from outside during the course of the growth.

(4) It has rotating seals through which rotation is transmitted to the growing crystal and the crucible.

(5) It has a particular portion whose temperature is kept not only constant, but also lowest in the whole chamber-wall so that the arsenic pressure in the chamber may be controlled by the temperature of the particular portion.

SUMMARY OF THE INVENTION

It is therefore an object of the present invention to provide an apparatus suitable for growing single crystals of dissociative compounds, with a volatile component gas sealed at a controlled pressure in a chamber in which a single crystal is pulled, wherein the chamber is made of one or more materials selected from the group consisting of ceramics, gas-tight carbon, heat-resistant metallic materials, ceramic-coated carbon, ceramic-coated heat-resistant metallic materials, ceramic-coated stainless steel, ceramic-coated nickelbased alloys and ceramic-coated cobalt-based alloys, the chamber can be divided and has a structure that the divided portions of the chamber can be sealed tightly, and an optical window is provided in the chamber through which the growing state of the crystal in the chamber can be observed.

Another object of the present invention is to provide an apparatus of the above type in which a solid or liquid sealing material or a combination of such sealing materials is applied to the joint of the divided portions of the apparatus and in order to exert a pressure to the joint, a pressure application mechanism for pushing one of the divided parts of the chamber is attached to the apparatus.

BRIEF DESCRIPTION OF THE DRAWINGS

In the drawings,

FIG. 3 shows a modified joint portion for the apparatus shown in FIG. 2 according to the present invention.

FIG. 4(a) and FIG. 4(b) show preferred sealing methods of an optical window disposed on the flange of the growth chamber.

DETAILED DESCRIPTION OF THE PREFERRED EMBODIMENTS

Figure 1:
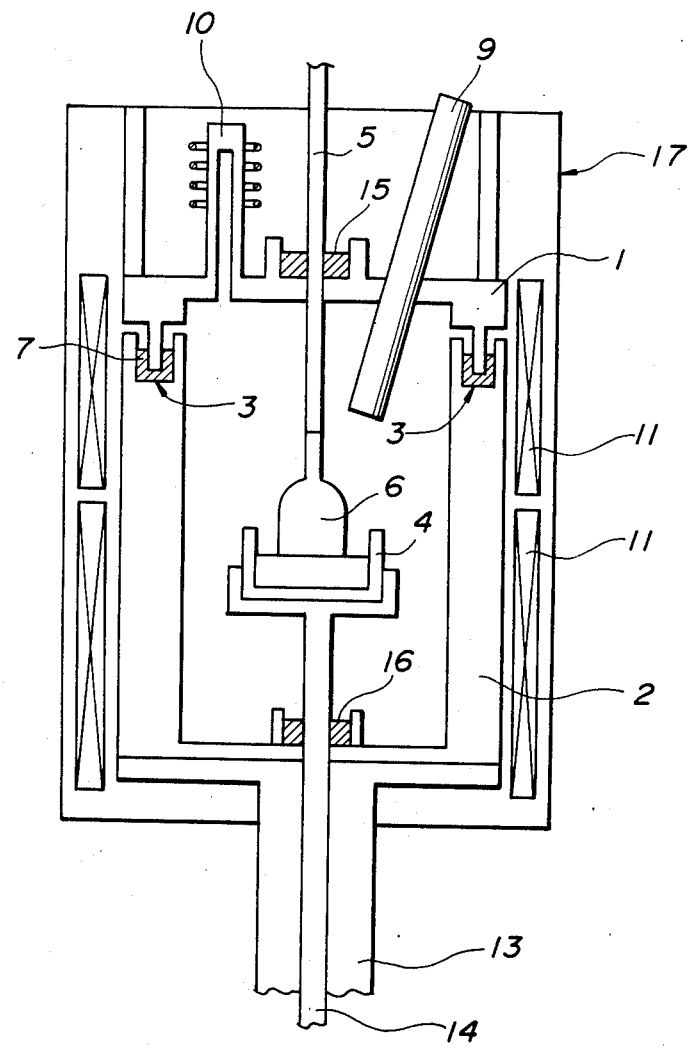
FIG. 1 shows a schematic cross-sectional view of an embodiment of an apparatus for growing single crystals of dissociative compounds according to the present invention.

A growth chamber in the present invention can be made of one or more materials selected from the following groups (A) through (D):

(A) Ceramics (silicon carbide, silicon nitride, SIALON, boron nitride, aluminum nitride, alumina, zirconia, titanium carbide and titanium nitride)

(B) Gas-tight carbon (C) Heat-resistant metallic materials (molybdenum, molybdenum alloys, tungsten and tungsten alloys)

(D) Ceramic-coated carbon and ceramic-coated heat-resistant metallic materials including molybdenum, molybdenum alloys, tungsten, tungsten alloys, stainless steel, nickel-based alloys and cobalt-based alloys.

In order to select the above materials, the following tests were carried out:

Each test piece was placed in an As atmosphere at a pressure of 1 atm and at temperatures ranging from 600° C. to 1250° C. for about 20 hours.

In this test, for instance, a heat-resistant steel (K-63), a cobalt-based alloy (HS 25) and a nickel-based alloy (Hastelloy) which are well-known as heat-resistant materials were easily attacked by the As atmosphere when they were in an untreated state, and were found unsuitable for use in the present invention. In contrast, the above test indicated that the above-listed materials were all suitable for use in the present invention. For instance, the above-mentioned ceramic materials are highly resistant against the As atmosphere at high temperatures and also resistant against creep, although they are difficult to process in a fine design. Therefore, the ceramic materials are most suitable for making a pipe-formed part of the chamber which is subjected to extremely high temperatures and can be made in a simple design. On the other hand, the heat-resistant metals and ceramic-coated metals are less resistant against the arsenic atmosphere at high temperatures. However, they can easily be processed in a fine design. Therefore, those materials are suitable for making the upper and lower flanges of the chamber.

The above materials were subjected to tests similar to the above, using phosphorus, another volatile element, instead of arsenic. The tests also indicated that the above materials can be used in a phosphorus atmosphere.

The growth chamber is constructed in such a way that it can be divided into two parts or more.

To make the junction tight for the divided portions, liquid sealing materials such as $B_2O_3$ and Ga can be employed. Since Ga reacts with a volatile component gas at high temperatures to form a compound layer (for instance, in the case of As gas, GaAs is formed by the reaction), $B_2O_3$ is more suitable than Ga for repeated use of the sealing material.

Solid sealing materials such as an expanded graphite gasket can be advantageously applied to sealing portions, because it needs only a simple joint structure which can be formed with any chamber material listed above. The sealing operation with the solid sealing material becomes easier than in the case of the liquid sealing material which may be overflowed by large pressure difference across the chamber-wall. Furthermore, changing procedure of the sealing material becomes easier.

It is also possible to use a solid sealing material and a liquid sealing material in combination. For instance, sealing can be performed by a solid sealing material immersed in a liquid sealing material. In this case, sealing becomes more tight and at the same time, the growth process becomes free from contamination by impurities from the solid sealing material.

Furthermore, the apparatus is equipped with a mechanism for applying appropriate pressure to the joint of the divided portion. The object of this mechanism is firstly to exert pressure to the joint in order to make the joint tight in the case of the solid sealing material or to make the joint close enough in the case of the liquid sealing material so as to prevent the liquid to flow rapidly out of the joint portion due to the pressure difference across the chamber wall. This mechanism is secondly for preventing the chamber from being broken by the thermal expansion of the chamber itself.

An example of such mechanism is a pushing-up mechanism including a spring suspension by which the lower portion of the chamber is resiliently supported. The object of the machanism can be attained by using a spring having appropriate strength and by detecting the reduced length of the spring so as to apply appropriate pressure to the joint. Alternatively, the pressure to the joint can be automatically controlled by using a load cell instead of the spring.

Because the chamber is made of opaque materials, a specially disposed optical window is necessary in order to observe the growing state of the crystal in the chamber. The optical window is of a rod or a plate shape of an optically transparent material like quartz, sealed to the growth chamber by a taper joint, or a gasket.

FIG. 4(a) shows a taper joint to seal a junction between a quartz rod 9 and the flange 1 of the growth chamber. Mounting and demounting of the junction can be done from outside, so that the destruction of the rod due to the different thermal expansion of the rod and the flange material can be avoided. FIG. 4(b) shows another example in which a junction between the quartz rod 9 and the flange 1 is made by a solid sealing material. In these examples, a pressure necessary to make the junction tight can be applied by a screw mechanism (not shown) which is disposed on the outer chamber.

A growing crystal and a crucible are turned in the desired directions and are moved in the longitudinal direction by shaft transmissions with the intention of causing uniform crystal growth to proceed. Two seals for these turning shafts which are disposed on the flanges of the growth chamber consist of liquid $B_2O_3$. The rotating seal on the upper flange can be used as a pressure sensor. If the arsenic pressure in the growth chamber becomes a little higher than that outside the chamber, arsenic gas bubbles are formed at the narrow gap in the rotating seal. Thus, pressure balancing is attained by increasing the pressure outside the chamber so as to kill the bubbles.

Embodiments of an apparatus for growing single crystals of dissociative compounds according to the present invention will now be explained by referring to the accompanying drawings. FIG. 1 shows an embodiment of a crystal pulling apparatus in which a crystal is pulled in a sealed chamber. The chamber is divided into two parts 1 and 2 and the divided portions of the sealed chamber are sealed with liquid $B_2O_3$. The sealed chamber has two rotating seals 15 and 16 which consist of liquid $B_2O_3$. An upper flange 1, made of gas-tight carbon, and a lower chamber portion 2, made of gas-tight carbon, are joined to each other by immersing the lower end portion of the upper flange 1 into the liquid $B_2O_3$ 7 in a groove 3. To prevent the growth chamber from being destructed due to the thermal expansion of the chamber itself, an expansion margin is carefully taken in the sealing portion 3 when the lower chamber portion 2 is lifted up by a driving shaft 13 which is linked with a chamberdriving mechanism (not shown). An optical window 9 is made of a quartz rod and a taper joint shown in FIG. 4(a) is adopted to make a seal between the optical window 9 and the upper flange portion 1. The temperature at the inner front of the window is maintained at an appropriate temperature between 610° C. and 950° C. A projected portion 10 disposed on the upper flange 1 is an arsenic pressure controlling furnace. Reference numeral 11 represents a heater.

In order to produce a GaAs single crystal using the apparatus shown in FIG. 1, 2 kg of pre-synthesized GaAs, 15 g of surplus As and 0.6 g of Si were charged into a $SiO_2$ crucible 4. After the whole apparatus 17 was evacuated and the $B_2O_3$ in the groove 3 was melted by heating it up to about 450° C., the growth chamber was sealed by pushing the lower chamber portion 2 upwards. The As pressure in the growth chamber was maintained at a desired pressure by controlling the temperature of the As pressure controlling furnace 10, while the crucible was heated so as to melt the source GaAs. The crucible 4 was rotated by a shaft 14 extending through a rotating seal 16. Thereafter, a GaAs single crystal 6 was grown by pulling and rotating the seed shaft 5 in accordance with the Czochralski method.

Figure 2:
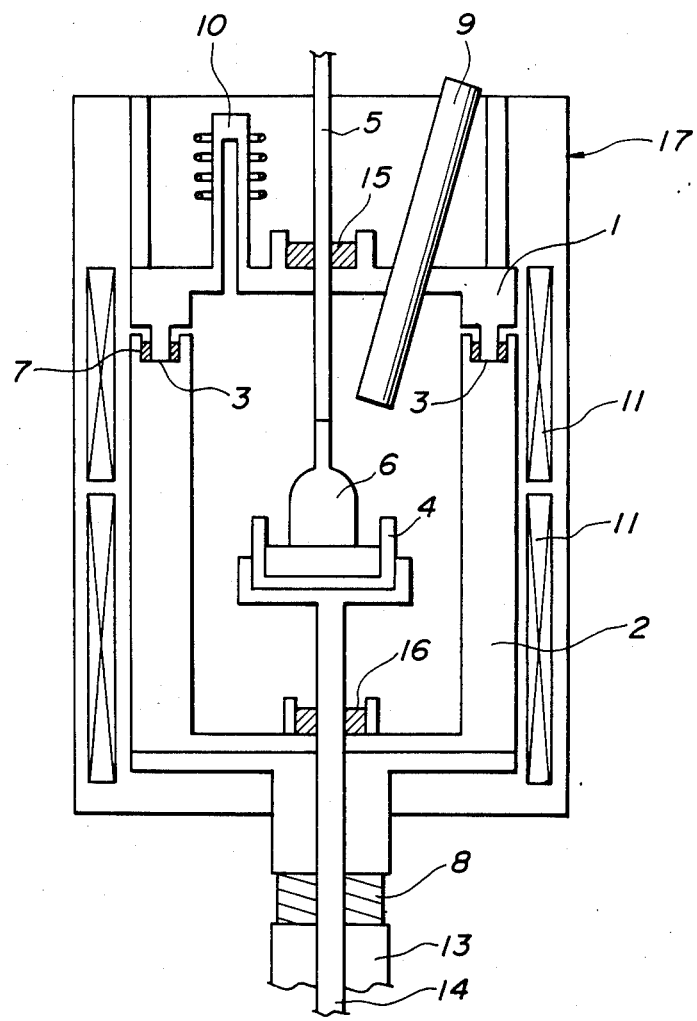
FIG. 2 shows a schematic cross-sectional view of an embodiment of an apparatus for growing single crystals of dissociative compounds according to the present invention with a coil spring inserted in a chamber-driving shaft.

FIG. 2 shows another embodiment of a crystal pulling apparatus in which a crystal is pulled in a sealed chamber. The chamber is divided into two portions 1 and 2 and the divided portions of the chamber are sealed with liquid $B_2O_3$. The chamber has two rotating seals 15 and 16 which consist of liquid $B_2O_3$. An upper flange 1, made of molybdenum, and a lower chamber portion 2, made of alumina, are joined to each other by placing liquid $B_2O_3$ 7 in a groove 3 formed in the uppermost part of the lower chamber portion 2 and by immersing the lower end of the upper flange 1 into the sealing liquid. A spring 8 is inserted in the middle of the driving shaft 13 which is linked with a chamber-driving mechanism (not shown). The spring constant is chosen so as to apply a pressure of 20-30 kg/cm$^2$ to the contact portion between the upper flange 1 and the lower chamber portion 2. By the spring 8, uniform and close contact of the divided chamber portions 1 and 2 is facilitated. Furthermore, a thermal expansion margin can be taken automatically with the sealed chamber even after the close contact of the divided chamber portions is completed. In other words, the pressure applied to the wall of the sealed chamber can be maintained in a sufficiently safe range by the spring 8 having an appropriate spring constant.

In the figure, reference numeral 9 represents an optical window made of quartz. The temperature at the inner front of the window is maintained at an appropriate temperature between 610° C. and 950° C. Through this window the growing state of the single crystal in the chamber can be observed from outside. A projected part 10 on the upper flange is an arsenic pressure controlling furnace and reference numeral 11 represents a heater.

In order to produce a GaAs single crystal using the apparatus shown in FIG. 2, 1 kg of a mixture of Ga and As was charged into a PBN crucible 4. After the whole apparatus 17 was entirely evacuated and the $B_2O_3$ in the groove 3 was melted by heating it up to about 450° C., the growth chamber was sealed by pushing up the lower chamber portion 2. The As pressure in the growth chamber was maintained at a desired pressure by controlling the temperature of an As pressure controlling furnace 10. GaAs was then directly synthesized in the sealed chamber by heating the crucible up to 1240° C. by the heater 11. The crucible 4 was rotated by a shaft 14 extending through a rotating seal 16. Thereafter, a GaAs single crystal 6 was grown by pulling and turning the seed shaft 5 in accordance with the Czochralski method. Owing to a coil spring 8, the growth chamber was not destroyed in spite of the thermal stress caused thereto by the heating-up process. The operation of balancing pressure across the chamber-wall became much easier than in the case of the apparatus shown in FIG. 1. This is because the pressure difference across the growth chamber did not cause any immediate overflow of $B_2O_3$ in the groove 3 due to the close contact of the divided portions of the growth chamber. The arsenic loss during the whole pulling operation was not more than 1% of the source material. No blur was formed on the optical window 9.

FIG. 3 shows a modified joint portion of the embodiment shown in FIG. 2 of an apparatus for growing single crystals of dissociative compounds according to the present invention, in which a solid sealing material 12 is employed for sealing the joint portion. As the solid sealing material 12, an expanded graphite plate is employed, which is flexible and free from reaction with As gas at high temperatures and shows high sealing performance. To make the seal tight, a chamber driving mechanism (not shown) having the previously mentioned spring 8 as a stress-relaxation mechanism is employed for resiliently supporting the lower chamber portion 2 thereon, so that appropriate pressure is always exerted uniformly to the solid sealing material 12, whereby the destruction of the sealed chamber by its thermal expansion is avoided. It is preferable that the contact area of the two chamber portions 1 and 2 be made small in order that the pressure applied to the chamber be effectively applied to the contact area. For this purpose, the lower end of the upper flange is made round in shape as shown in FIG. 3.

By applying the solid sealing material with an appropriate pressure exerted thereon, a tight seal of the divided chamber portions was realized and both the operation of balancing pressure across the chamber-wall during the growth process and the maintenance of the sealing material became significantly easier.

In the above described embodiments, GaAs was taken as a representative dissociative compound. However, the present invention is not limited to GaAs. Other dissociative compounds, for instance, As compounds such as InAs, and P compounds such as InP or GaP, can also be employed.

In the present invention, the sealed chamber for containing the volatile component gas is constructed so as to be capable of being divided and sealed, whereby a grown crystal is easily taken out and the growth chamber can be used repeatedly. Further, by pressing the joint containing a solid or liquid sealing material in the divided portion of the sealed chamber, highly close contact of the joint portions is attained, whereby the operation for balancing the pressure across the chamber wall is significantly improved and the arsenic dissociative loss can be extraordinarily reduced. The apparatus according to the present invention is made of materials sufficiently strong, at high temperatures at which single crystals are grown, highly resistive against the volatile component gas atmosphere, and can be used in repetition. Thus, single crystals of semi-conducting dissociative compounds with low dislocation density can be constantly obtained by the present invention.

What is claimed is:

1. An apparatus for growing large diameter, single crystals of GaAs in an atmosphere of As gas, which comprises:
   a gas-tight, sealable growable chamber comprising a lower chamber portion and a separate, removable, upper, closure member closing said lower chamber portion, said lower chamber portion and said upper closure member having separable, interfitting, sealing members extending around perimeters thereof, a sealing material disposed between said sealing members so that said sealing members are in sealing relationship with each other and said growth chamber is sealed, said sealing material being selected from the group consisting of molten $B_2O_3$, expanded graphite and a combination of molten $B_2O_3$ and expanded graphite, said growth chamber being made of one or more materials which are resistant to As gas at high temperatures, are resistant to creep at high temperature and are selected from the group consisting of silicon carbide, silicon nitride, boron nitride, aluminum nitride, alumina, zirconia, titanium carbide, titanium nitride, gas-tight carbon, molybdenum, molybdenum alloys, tungsten, tungsten alloys, ceramic-coated carbon, ceramic-coated molybdenum, ceramic-coated molybdenum alloys, ceramic-coated tungsten, ceramic-coated tungsten alloys, ceramic-coated stainless steel, ceramic-coated nickel-based alloys and ceramic-coated cobalt-based alloys;
   a vertical, rotatable, first shaft extending upwardly into said growth chamber and first liquid sealing means for sealing said first shaft to said growth chamber to prevent leakage of As gas therebetween;
   a crucible mounted on said first shaft within said growth chamber for containing a melt of GaAs, said crucible being rotatable with said first shaft;
   a vertical, rotatable and axially movable, second shaft extending downwardly into said growth chamber and second liquid sealing means for sealing said second shaft to said growth chamber to prevent leakage of As gas therebetween, said second shaft positionable for immersing a seed crystal into a melt in said crucible, said second shaft being rotatable and vertically movable for growing a single crystal by the crystal pull technique;
   a quartz optical window in said growth chamber for permitting visual inspection of said crucible and a crystal growing process therein and an expanded graphite gasket for sealing said quartz optical window to said upper closure member;
   pressure-applying means for urging said lower chamber portion and said upper closure member toward each other and thereby urging said sealing members into engagement with said sealing material to continously maintain said sealing members in sealing engagement with said sealing material during the crystalgrowing process; and
   means for heating said growth chamber.

2. An apparatus according to claim 1 in which said pressure-applying means comprise a spring means for continuously urging said lower chamber portion upwardly under a predetermined pressure.

3. An apparatus according to claim 1 in which said sealing members include an upwardly opening annular groove formed in the upper end of said lower chamber portion, said groove holding an expanded graphite gasket and being at least partially filled with a sealing material of liquid $B_2O_3$, and said upper closure member has a downwardly extending annular flange which is rounded in cross section and extends downwardly into said groove to sealingly contact said sealing material therein and sealingly engage said gasket.

4. An apparatus according to claim 1 in which said heat-resistant metallic materials are selected from the group consisting of molybdenum, molybdenum alloys, tungsten, and tungsten alloys.

5. An apparatus according to claim 1 in which said sealing members comprise an upwardly opening annular groove formed in the upper end of said lower chamber portion, said groove being at least partially filled with a sealing material consisting of $B_2O_3$, and said upper closure member has a downwardly extending annular flange that extends downwardly into said groove and sealingly contacts said sealing material therein.

6. An apparatus according to claim 5 in which an annular, expanded graphite gasket is immersed and positioned in said sealing material.

7. An apparatus according to claim 1 in which said sealing members include an annular, expanded graphite gasket on the upper end of said lower chamber portion, said upper closure member having a downwardly extending annular flange that extends downwardly into sealing engagement with said gasket.

8. An apparatus according to claim 7, wherein the surface of said downwardly extending annular flange which sealingly engages said gasket is rounded in cross section to minimize the area of contact between said downwardly extending flange and said gasket.

9. An apparatus for growing large diameter single crystals of GaAs in an atmosphere of As gas, which comprises:

a gas-tight, sealed housing having an internal, upright growth chamber comprising a lower, cup-shaped, cylindrical, chamber portion having an open top and a separate, removable, upper closure member extending across and closing the open top of said chamber portion, said lower chamber portion and said upper closure member having separable, interfitting, sealing members extending around perimeters thereof and defining a tongue and groove joint, said groove being provided in said lower chamber portion and said tongue being provided in said upper closure member, a first sealant disposed in the bottom of said groove and sealingly engaging said tongue so that said crystal growth chamber is sealed, said first sealant being selected from the group consisting of molten $B_2O_3$, expanded graphite and a combination of molten $B_2O_3$ and expanded graphite, said growth chamber being made of one or more materials resistant to As gas at temperatures of at least 610° C., and resistant to creep at high temperature, selected from the group consisting of: silicon carbide, silicon nitride, boron nitride, alumimum nitridie, alumina, zirconia, titanium carbide, titanium nitride, gas-tight carbon, molybdenum, molybdenum alloys, tungsten, tungsten alloys, ceramic-coated carbon, ceramic-coated molybdenum, ceramic-coated molydenum alloys, ceramic-coated tungsten, ceramic-coated tungsten alloys, ceramic-coated stainless steel, ceramic-coated nickel-based alloys and ceramic-coated cobalt-based alloys;

a vertical, rotatable first shaft extending upwardly through a bottom wall of said lower chamber portion into said growth chamber and first liquid sealing means for sealing said first shaft to said bottom wall to prevent leakage of fluid therebetween;

an open-top, cylindrical crucible mounted on said first shaft within said growth chamber for containing a melt of GaAs, said crucible being rotatable with said first shaft;

a vertical, rotable and axially movable second shaft extending downwardly through said upper closure member into said growth chamber and a second liquid sealing means for sealing said second shaft to said upper closure member to prevent leakage of As gas therebetween, said second shaft positionable for immersing a seed crystal into a melt in said crucible, said second shaft being rotatable and vertically movable for growing a single crystal by the crystal pulling technique;

a quartz optical window in said upper closure member for permitting visual inspection of said crucible and a crystal growing process therein, and an expanded graphite gasket for sealing said quartz optical window to said upper closure member;

a push rod connected to said lower chamber portion for urging it upwardly toward said upper closure member and into pressing engagement with said first sealant to continuously maintain said tongue and said groove in sealing engagement with said first sealant under a predetermined pressure during the crystal-growing process; and means for heating said growth chamber.

10. An apparatus according to claim 9 in which said upper closure member has an upwardly projecting hollow wall portion, the interior of which communicates with said growth chamber.

11. An apparatus according to claim 9 in which the size of said crucible is smaller than the size of the open top of said lower chamber portion so that said crucible can be removed through the open top of said lower chamber portion when said upper closure member is removed.

12. An apparatus according to claim 9 in which said optical window is a transparent quartz rod extending through said upper closure member, said quartz rod having a flange projecting laterally therefrom and received in a recess in said upper closure member and a solid expanded graphite gasket disposed in said recess for releasably sealing said quartz rod to said upper closure member.

* * * * *

UNITED STATES PATENT AND TRADEMARK OFFICE
CERTIFICATE OF CORRECTION

PATENT NO. : 4 704 257
DATED : November 3, 1987
INVENTOR(S) : Kenji TOMIZAWA et al It is certified that error appears in the above-identified patent and that said Letters Patent is hereby corrected as shown below:

Column 7, line 47; change "growable" to ---growth---.

Column 8, line 33; change "crystalgrowing" to ---crystal-growing---.

Column 9, line 37; change "nitridie," to ---nitride,---.

Signed and Sealed this

Third Day of May, 1988

Attest:

DONALD J. QUIGG

Attesting Officer

Commissioner of Patents and Trademarks